United States Patent
Lei et al.

(10) Patent No.: US 8,673,667 B2
(45) Date of Patent: Mar. 18, 2014

(54) METHOD FOR MANUFACTURING LIGHT EMITTING DIODE CHIP

(71) Applicant: Advanced Optoelectronic Technology, Inc., Hsinchu Hsien (TW)

(72) Inventors: Yen-Kei Lei, Hsinchu (TW); Ko-Wei Chien, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/854,143

(22) Filed: Apr. 1, 2013

(65) Prior Publication Data

US 2013/0252362 A1    Sep. 26, 2013

Related U.S. Application Data

(62) Division of application No. 13/177,557, filed on Jul. 7, 2011, now Pat. No. 8,431,934.

(30) Foreign Application Priority Data

Oct. 25, 2010    (CN) .......................... 2010 1 0519732

(51) Int. Cl.
*H01L 21/00* (2006.01)

(52) U.S. Cl.
USPC ............................................. 438/46

(58) Field of Classification Search
USPC ........................................ 257/76, 99; 438/46
See application file for complete search history.

(56) References Cited

U.S. PATENT DOCUMENTS

| 8,026,118 | B2 * | 9/2011 | Shinohara et al. | 438/46 |
| 2004/0000670 | A1 * | 1/2004 | Oh et al. | 257/76 |
| 2009/0159902 | A1 * | 6/2009 | Yasuda et al. | 257/88 |
| 2010/0109020 | A1 * | 5/2010 | Yoo | 257/76 |
| 2010/0163886 | A1 * | 7/2010 | Fukunaga et al. | 257/76 |

FOREIGN PATENT DOCUMENTS

| TW | 200525781 A | 8/2005 |
| TW | 200924230 A | 6/2009 |

* cited by examiner

*Primary Examiner* — Thao P. Le
(74) *Attorney, Agent, or Firm* — Altis Law Group, Inc.

(57) ABSTRACT

A manufacturing method of an LED chip includes the following steps: providing a substrate; forming a light emitting layer comprising an n-type semiconductor layer and a p-type semiconductor layer on the substrate; forming a pair of electrodes electrically connected the n-type semiconductor layer and the p-type semiconductor layer, respectively; connecting a bonding wire to one of the electrodes by adding melted metal to a portion of a top surface of the electrode, a ratio between an area of the portion of the top surface of the electrode and the top surface of the electrode being no less 6:10; and solidifying the melted metal to form a bonding pad to connect the bonding wire and the electrode together.

10 Claims, 3 Drawing Sheets

METHOD FOR MANUFACTURING LIGHT EMITTING DIODE CHIP

CROSS-REFERENCE TO RELATED APPLICATIONS

This patent application is a divisional application of patent application Ser. No. 13/177,557, filed on Jul. 7, 2011, entitled "LIGHT EMITTING DIODE CHIP AND MANUFACTURING METHOD THEREOF," which is assigned to the same assignee as the present application, and which is based on and claims priority from Chinese Patent Application No. 201010519732.3 filed in China on Oct. 25, 2010. The disclosures of patent application Ser. No. 13/177,557 and the Chinese Patent Application No. 201010519732.3 are incorporated herein by reference in their entirety.

BACKGROUND

1. Technical Field

The disclosure generally relates to a semiconductor light-emitting device and a method of manufacturing the same, and more particularly to an LED (light emitting diode) chip and a method of manufacturing the LED chip.

2. Description of Related Art

Light emitting diodes (LEDs) have many advantages, such as high luminosity, low operational voltage, low power consumption, compatibility with integrated circuits, easy driving, long term reliability, and environmental friendliness. These advantages have promoted wide use of the LEDs as a light source.

An LED chip is the core of the LED. The LED chip includes a pair of electrodes electrically connecting to outer electrodes via gold wires. To firmly secure the gold wires to the LED chip, glue is usually used. However, during the encapsulation process or use of the LED, the connections between the gold wires and the LED chip are easily to break, making the LED not able to work normally, which results in poor work stability and reliability of the LED.

What is needed, therefore, is an LED chip which can overcome the described limitations.

DETAILED DESCRIPTION

Figure 1:
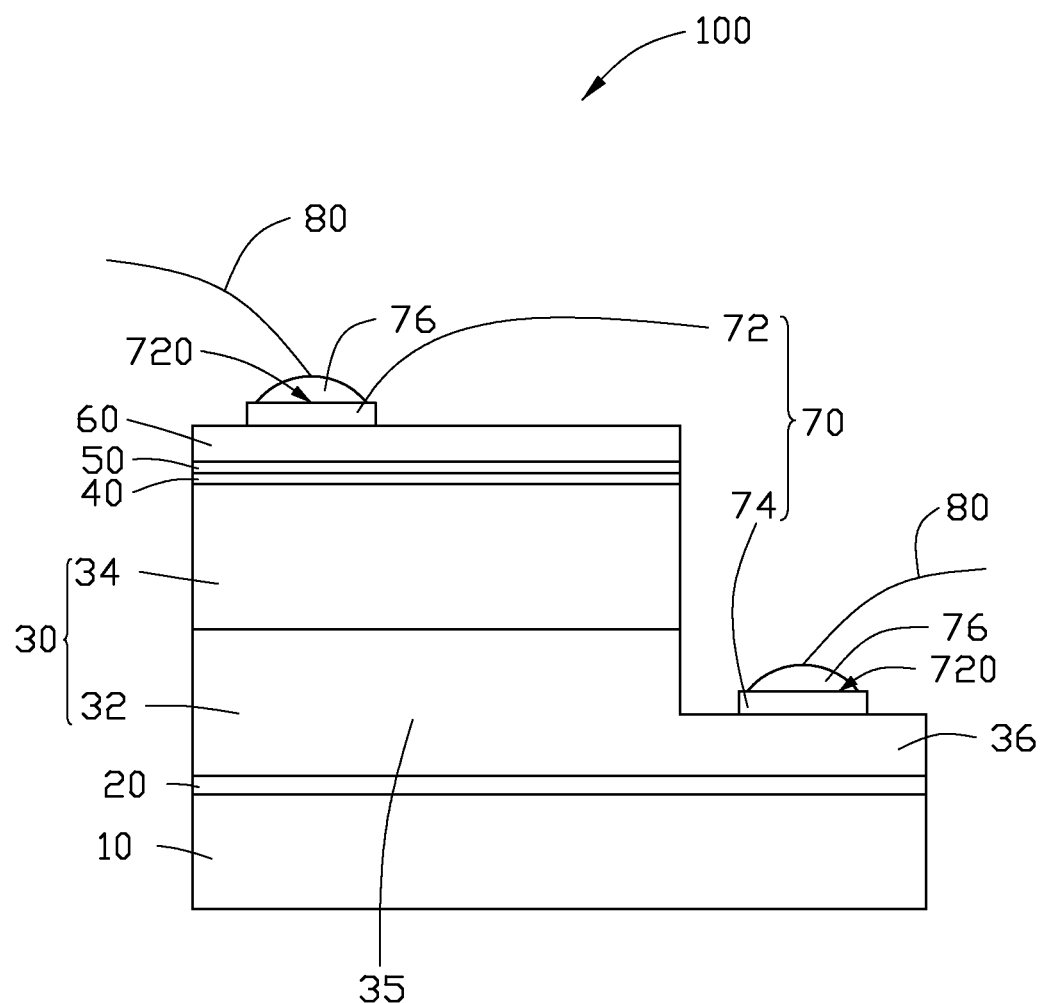
FIG. 1 is a schematic, side view of an LED chip in accordance with a first exemplary embodiment of the present disclosure.

Reference will now be made to the drawing figures to describe the present disclosure in detail.

Figure 2:
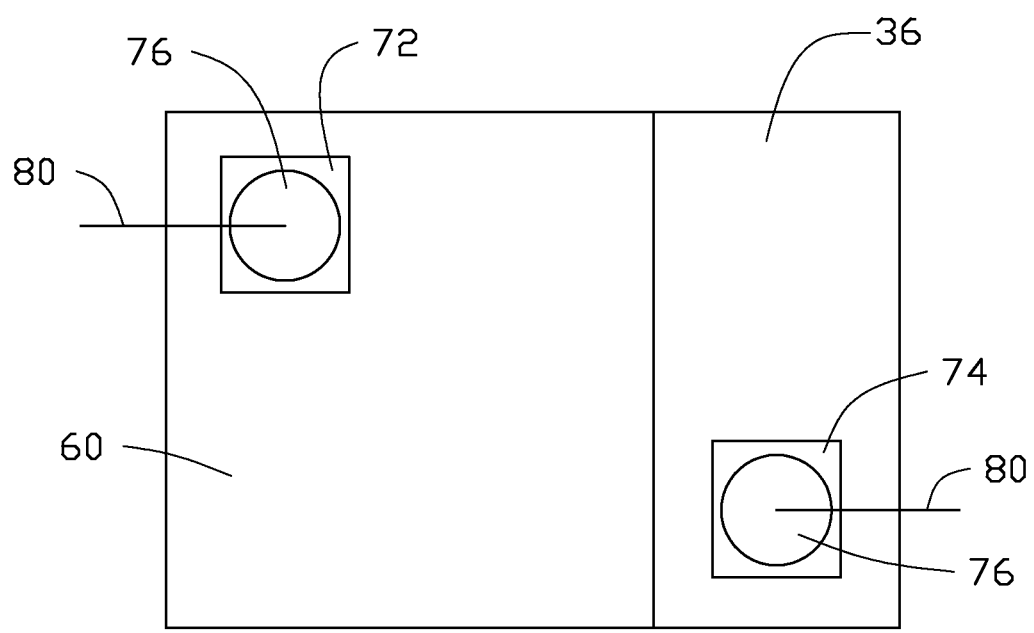
FIG. 2 is a top view of the LED chip of FIG. 1.

Referring to FIGS. 1 and 2 together, an LED chip 100 in accordance with a first embodiment of the present disclosure includes a substrate 10, a buffer layer 20, a light emitting layer 30, an ohmic contact layer 40, a current diffusion layer 50 and a transparent electric conduction layer 60 arranged in sequence along a bottom to top direction. The LED chip 100 further includes a pair of electrodes 70 located at a top side thereof.

The substrate 10 is made of one of the materials including aluminum oxide ($Al_2O_3$), silicon carbide (SiC), silicon (Si), silicon carbide (GaN) and zinc oxide (ZnO).

The buffer layer 20 fully covers a top surface of the substrate 10, and is made of GaN or aluminum nitride (AlN). The buffer layer 20 is configured to decrease a stress generated between the light emitting layer 30 and the substrate 10 due to the lattice difference thereof.

The light emitting layer 30 includes an n-type semiconductor layer 32 directly connected to the buffer layer 20 and a p-type semiconductor layer 34 located on a top side of the n-type semiconductor layer 32. The n-type semiconductor layer 32 includes a first portion 35 aligned with the p-type semiconductor layer 34 and a second portion 36 thinner than the first portion 35. Bottom sides of the first portion 35 and the second portion 36 are coplanar to each other, and cooperatively from a planar bottom surface of the n-type semiconductor layer 32 to connect with a top surface of the buffer layer 20. A top side of the second portion 36 is lower than a top side of the first portion 35. The n-type semiconductor layer 32 is made of an n-type gallium nitride-based III-V Group compound semiconductor such as an n-type GaN. The p-type semiconductor layer 34 is arranged on the first portion 35 of the n-type semiconductor layer 32, and is made of a p-type gallium nitride-based III-V Group compound semiconductor such as a p-type GaN.

Alternatively, when forming the light emitting layer 30, indium gallium nitride (InGaN) and aluminum gallium nitride (AlGaN) doped with controlled amounts of impurity can be used with different ratio to form different structures, such as double heterostructure, single quantum well structure or multiple quantum well structure.

The ohmic contact layer 40, the current diffusion layer 50 and the transparent electric conduction layer 60 are arranged in sequence on a top surface of the p-type semiconductor layer 34. The ohmic contact layer 40 can be made of aluminum indium gallium nitride (InAlGaN) doped with controlled amount of magnesium (Mg) or GaN doped with controlled amount of Mg. The material forming the transparent electric conduction layer 60 is not particularly limited, as along as it is transparent, and electrically conductive. A preferable material is indium tin oxide (ITO). The ITO is colorless and transparent, regardless of how thick it is, and has good electric conductivity.

The electrodes 70 include a first electrode 72 formed on a top surface of the transparent electric conduction layer 60 and a second electrode 74 formed on the top side of the second portion 36 of the n-type semiconductor layer 32. The first electrode 72 is connected with a bonding wire 80, such as a gold wire, by a bonding pad 76 formed on a connecting portion 720 of a top surface of the first electrode 72. Similarly, the second electrode 74 is connected with another bonding wire 80, such as a gold wire, by another bonding pad 76 formed on another connecting portion 740 of a top surface of the second electrode 74. The first electrode 72 and the second electrode 74 are made of material with good electrical conductivity, such as gold, aluminum or an alloy thereof.

Each of the boning pads 76 is generally hemispheric in shape, and has a planar bottom side contacting with the corresponding connecting portion 720. A ratio between an area of each of the connecting portions 720 and an area of the corresponding top surface of each of the first and second electrodes 72, 74 is not less than 6:10. Thus, firm connections between the bonding wires 80 and the first and second electrodes 72, 74 of the LED chip 100 can be obtained, thereby improving a work stability and reliability of the LED chip 100. Preferably, the ratio between the area of each of the connecting portions 720 and the area of the corresponding top surface of each of the first and second electrodes is substantially 8:10.

The bonding pads 76 are made of metal. During the manufacturing of the LED chip 100, melted metal is gradually added to the connecting portions 720 of the top surfaces of the first and second electrodes 72, 74. When the melted metal is added to an amount that the connecting portions 720 are fully covered by the melted metal, the application of the melted metal is stopped. Then the melted metal solidifies and forms the bonding pads 76 to interconnect the bonding wires 80 and the first and second electrodes 72, 74 together. The ratio between the area of each of the connecting portions 720 and the corresponding top surface of each of the first and second electrodes 72, 74 should be less than 1:1, whereby excessive melted metal overflowing the top surfaces of the first and second electrodes 72, 74 onto the transparent electric conduction layer 60 and the second portion 36 of the n-type semiconductor layer 32 can be avoided. The overflow of the melted metal can affect the light extracting efficiency of the LED chip 100.

Figure 3:
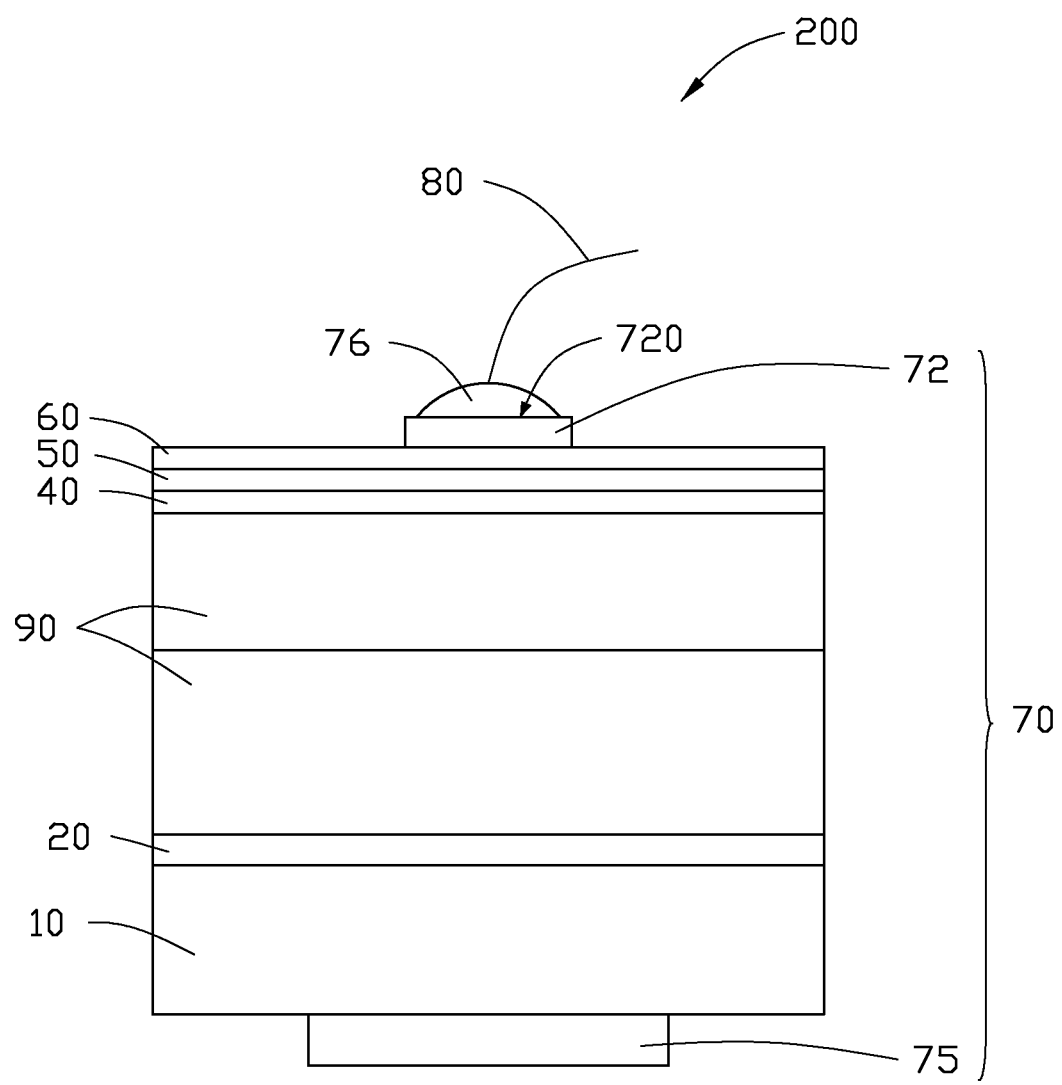
FIG. 3 is a schematic, side view of an LED chip in accordance with a second exemplary embodiment of the present disclosure.

Referring to FIG. 3, an LED 200 according to a second exemplary embodiment is shown. The LED 200 differs from the previous embodiment only in that the second electrode 75 is formed at a bottom surface of the substrate 10 without bonding wire and bonding pad thereon. When the LED chip 200 is used, the second electrode 75 is directly electrically connected to an outer electrode by a surface mounting technology.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A manufacturing method of an LED (light emitting diode) chip, comprising:
   providing a substrate;
   forming a light emitting layer comprising an n-type semiconductor layer and a p-type semiconductor layer on the substrate;
   forming a pair of electrodes electrically connected to the n-type semiconductor layer and the p-type semiconductor layer, respectively;
   connecting a bonding wire to at least one of the electrodes by adding melted metal to a portion of a top surface of the at least one of the electrodes, a ratio between an area of the portion of the top surface of the at least one of the electrodes and the top surface of the at least one of the electrodes being no less 6:10; and
   solidifying the melted metal to form a bonding pad to connect the bonding wire and the at least one of the electrodes together.

2. The method of claim 1, wherein the ratio is substantially 8:10.

3. The method of claim 1, wherein a step of forming a buffer layer on the substrate is performed prior to the step of forming a light emitting layer.

4. The method of claim 3, wherein a step of forming an ohmic contact layer, a current diffusion layer and a transparent electric conduction layer in sequence on the light emitting layer is performed prior to the step of forming a pair of electrodes.

5. The method of claim 4, wherein the pair of electrodes comprise a first electrode and a second electrode, the first electrode is located on the transparent electric conduction layer, and the second electrode is located on the n-type semiconductor layer.

6. The method of claim 4, wherein the pair of electrodes comprise a first electrode and a second electrode, the first electrode is located on the transparent electric conduction layer, and the second electrode is located on a bottom surface of the substrate.

7. The method of claim 1, wherein the n-type semiconductor layer is made of an n-type gallium nitride-based III-V Group compound semiconductor, and the p-type semiconductor layer is made of a p-type gallium nitride-based III-V Group compound semiconductor.

8. The method of claim 7, wherein the n-type semiconductor layer is made of n-type GaN, and the p-type semiconductor layer is made of p-type GaN.

9. The method of claim 1, wherein the bonding pad is substantially hemispherical in shape.

10. The method of claim 9, wherein the bonding pad has a planar bottom surface connecting the top surface of the at least one of the electrodes.

* * * * *